United States Patent
Yazaki

(10) Patent No.: US 9,016,839 B2
(45) Date of Patent: Apr. 28, 2015

(54) LIQUID EJECTING HEAD, LIQUID EJECTING APPARATUS AND ACTUATOR

(71) Applicant: Seiko Epson Corporation, Tokyo (JP)

(72) Inventor: Shiro Yazaki, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/850,546

(22) Filed: Mar. 26, 2013

(65) Prior Publication Data

US 2013/0265371 A1   Oct. 10, 2013

(30) Foreign Application Priority Data

Apr. 5, 2012   (JP) .................. 2012-086886

(51) Int. Cl.
| | |
|---|---|
| *B41J 2/045* | (2006.01) |
| *B41J 2/015* | (2006.01) |
| *B41J 2/14* | (2006.01) |
| *H01L 41/047* | (2006.01) |
| *H01L 41/09* | (2006.01) |

(52) U.S. Cl.
CPC ............ *B41J 2/14274* (2013.01); *H01L 41/047* (2013.01); *H01L 41/0973* (2013.01); *B41J 2/14233* (2013.01); *B41J 2002/14241* (2013.01); *B41J 2002/14419* (2013.01); *B41J 2202/11* (2013.01)

(58) Field of Classification Search
None
See application file for complete search history.

(56) References Cited

U.S. PATENT DOCUMENTS

2009/0284568 A1 * 11/2009 Yazaki ............................ 347/68

FOREIGN PATENT DOCUMENTS

JP    2009172878 A    8/2009

* cited by examiner

*Primary Examiner* — Matthew Luu
*Assistant Examiner* — Erica Lin
(74) *Attorney, Agent, or Firm* — Harness, Dickey & Pierce, P.L.C.

(57) ABSTRACT

A liquid ejecting head including a pressure generation chamber communicating with a nozzle. The head includes a piezoelectric element having a first electrode, a piezoelectric layer, provided on the first electrode, a second electrode provided on the piezoelectric layer, and a third electrode provided on the second electrode. The third electrode is provided on the second electrode to cover a region that faces the pressure generation chamber.

13 Claims, 6 Drawing Sheets

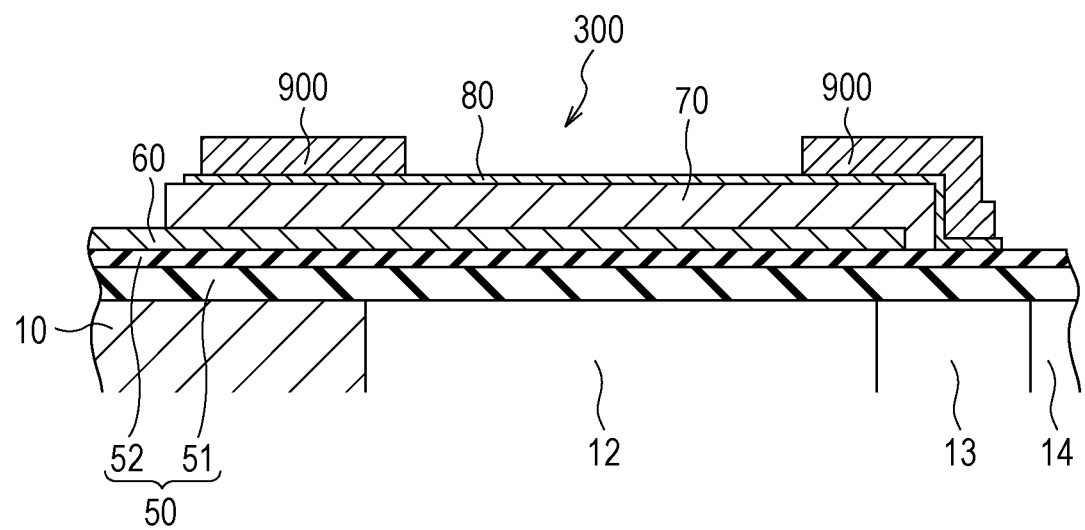
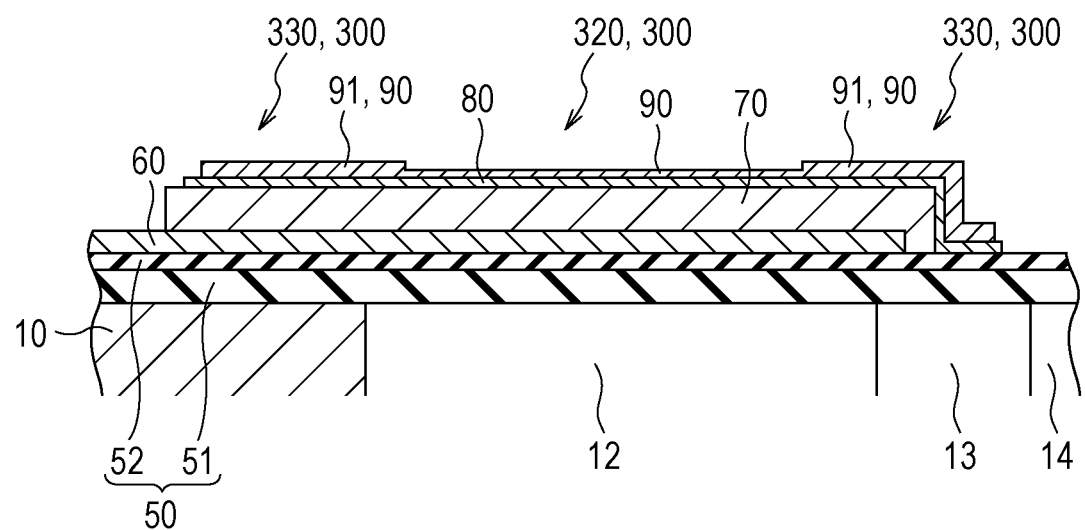

LIQUID EJECTING HEAD, LIQUID EJECTING APPARATUS AND ACTUATOR

BACKGROUND

1. Technical Field

The present invention relates to a liquid ejecting head in which liquid droplets are ejected from a nozzle by deforming a piezoelectric element and a liquid ejecting apparatus, and more particularly, a structure of an actuator including the piezoelectric element.

2. Related Art

In the related art, a liquid ejecting head has been disclosed, in which liquid droplets are ejected from a nozzle communicating with a pressure generation chamber by deforming a piezoelectric element (an actuator) and then by generating a pressure change in the liquid inside a pressure generation chamber. A representative example thereof is an ink jet type recording head ejecting ink droplets as the liquid droplets.

The ink jet type recording head includes, for example, the piezoelectric element on one side of a flow path formation substrate in which the pressure generation chamber communicating with the nozzle is provided, and the ink droplets are ejected from the nozzle by deforming a vibration plate by the driving of the piezoelectric element and then by generating the pressure change in the pressure generation chamber.

Here, the piezoelectric element is configured to include a first electrode, a piezoelectric layer and a second electrode which are provided on the vibration plate, and there is a problem that the piezoelectric layer may be easily destroyed, for example, due to the external environment such as moisture. In order to solve the problem, there has been a technique in which an outer periphery section of the piezoelectric layer is covered by the second electrode. For example, there has been a technique in which an individual electrode is formed by providing the first electrode for each pressure generation chamber and a common electrode is formed by continuously providing the second electrode throughout a plurality of the pressure generation chambers, and the outer periphery section of the piezoelectric layer is covered by the second electrode (see, for example, JP-A-2009-172878).

Destruction of the piezoelectric layer can be suppressed by covering the piezoelectric layer with the second electrode that is the common electrode as disclosed in JP-A-2009-172878.

However, in the piezoelectric element having such a configuration, stress concentration occurs at a boundary between a portion (an active portion) in which a piezoelectric strain occurs on the piezoelectric layer and a portion (a non-active portion) in which the piezoelectric strain does not occur when a voltage is applied between the first electrode and the second electrode.

In addition, in the configuration in which the first electrode, the piezoelectric layer and the second electrode configuring the piezoelectric element are extended to the outside of the pressure generation chamber, large stress concentration occurs further at an end portion of the pressure generation chamber that is a boundary between a portion (a flexible portion) facing the pressure generation chamber and a portion (a non-flexible portion) of the outside of the pressure generation chamber in the portion (the active portion) in which the piezoelectric strain occurs on the piezoelectric layer. Accordingly, there is a concern that burning, cracks or the like may occur.

In addition, there is a problem that since the second electrode is formed relatively thin, the resistance is great and reduction of liquid ejection characteristics or variation (a so-called electric crosstalk) is likely to occur due to the voltage drop.

In addition, such a problem also exists similarly in the liquid ejecting head ejecting the liquid besides the ink as well as in the ink jet type recording head.

SUMMARY

An advantage of some aspects of the invention is to provide a liquid ejecting head in which uniformity of the ejection characteristics of the liquid can be accomplished while suppressing destruction of a piezoelectric layer configuring a piezoelectric element, a liquid ejecting apparatus and an actuator.

According to an aspect of the invention, there is provided a liquid ejecting head includes a flow path formation substrate including a pressure generation chamber communicating with a nozzle; a vibration plate provided on the flow path formation substrate; a piezoelectric element having a first electrode provided on the vibration plate, a piezoelectric layer provided on the first electrode and a second electrode provided on the piezoelectric layer; and a third electrode provided on the second electrode, wherein the first electrode configures an individual electrode that is independent for each piezoelectric element and the second electrode configures a common electrode which is common in a plurality of the piezoelectric elements continuously provided along an arrangement direction of the pressure generation chamber, wherein the first electrode, the piezoelectric layer and the second electrode are extended to the outside of the pressure generation chamber in a longitudinal direction of the pressure generation chamber, and wherein the third electrode is provided by covering a region facing the pressure generation chamber.

Here, according to the aspect, it is preferable that a film thickness of the third electrode be thicker than a film thickness of the second electrode. In addition, according to the aspect, it is preferable that the third electrode be configured such that a film thickness of a portion facing an end portion of the pressure generation chamber in the longitudinal direction be thicker than a film thickness of a region facing the pressure generation chamber. Furthermore, according to the aspect, it is preferable that the third electrode be provided throughout an entire surface of the second electrode.

In this case, stress concentration according to the driving of the piezoelectric element can be suppressed and destruction of the piezoelectric layer due to the stress concentration can be effectively suppressed. In addition, since the resistance value of the second electrode that is the common electrode is substantially decreased, occurrence of the voltage drop can be suppressed even though a plurality of the piezoelectric elements are driving at the same time. Accordingly, uniformity of ejection characteristics can be accomplished between a plurality of the nozzles.

In addition, according to the aspect, it is preferable that in a case where the third electrode has a tensile stress and the second electrode has a compressive stress, the tensile stress of the third electrode be lower than the compressive stress of the second electrode. In this case, an initial bending amount of an arm portion of a so-called vibration plate is suppressed and the displacement amount of the vibration plate by the driving of the piezoelectric element is improved.

In addition, according to the aspect, it is preferable that the third electrode be formed of a material of which Young's modulus is smaller than that of the second electrode. In this case, inhibition of the displacement of the piezoelectric element can be suppressed by the third electrode.

In addition, according to the aspect, it is preferable that the third electrode be formed of at least one material selected from the group consisting of Au, Ag, Cu and Al. In this case, the destruction of the piezoelectric layer can be suppressed while decreasing reliably the resistance value of the second electrode.

Furthermore, according to another aspect of the invention, there is provided a liquid ejecting apparatus including the liquid ejecting head described above. In this case, the liquid ejecting apparatus having improved durability and ejection characteristics can be realized.

In addition, according to another aspect of the invention, there is provided an actuator which includes a vibration plate provided on a substrate; a piezoelectric element having a first electrode provided on the vibration plate, a piezoelectric layer provided on the first electrode and a second electrode provided on the piezoelectric layer; and a third electrode provided on the second electrode, wherein the first electrode configures an individual electrode that is independent for each piezoelectric element and the second electrode configures a common electrode which is common in a plurality of the piezoelectric elements continuously provided along an arrangement direction of the pressure generation chamber, wherein the first electrode, the piezoelectric layer and the second electrode are extended to the outside of the pressure generation chamber in a longitudinal direction of the pressure generation chamber, and wherein the third electrode is provided by covering a region facing the pressure generation chamber.

In this case, stress concentration according to the driving of the piezoelectric element can be suppressed and destruction of the piezoelectric layer due to the stress concentration can be effectively suppressed. In addition, since the resistance value of the second electrode is substantially decreased, occurrence of the voltage drop can be suppressed even though a plurality of the piezoelectric elements are driving at the same time. Accordingly, uniformity of ejection characteristics can be accomplished between a plurality of the nozzles.

BRIEF DESCRIPTION OF THE DRAWINGS

The invention will be described with reference to the accompanying drawings, wherein like numbers reference like elements.

FIG. 5 is a view illustrating an example of the configuration of the piezoelectric element.

FIG. 6 is a cross-sectional view illustrating a modification example of the piezoelectric element according to the embodiment of the invention.

DESCRIPTION OF EXEMPLARY EMBODIMENTS

Figure 1:
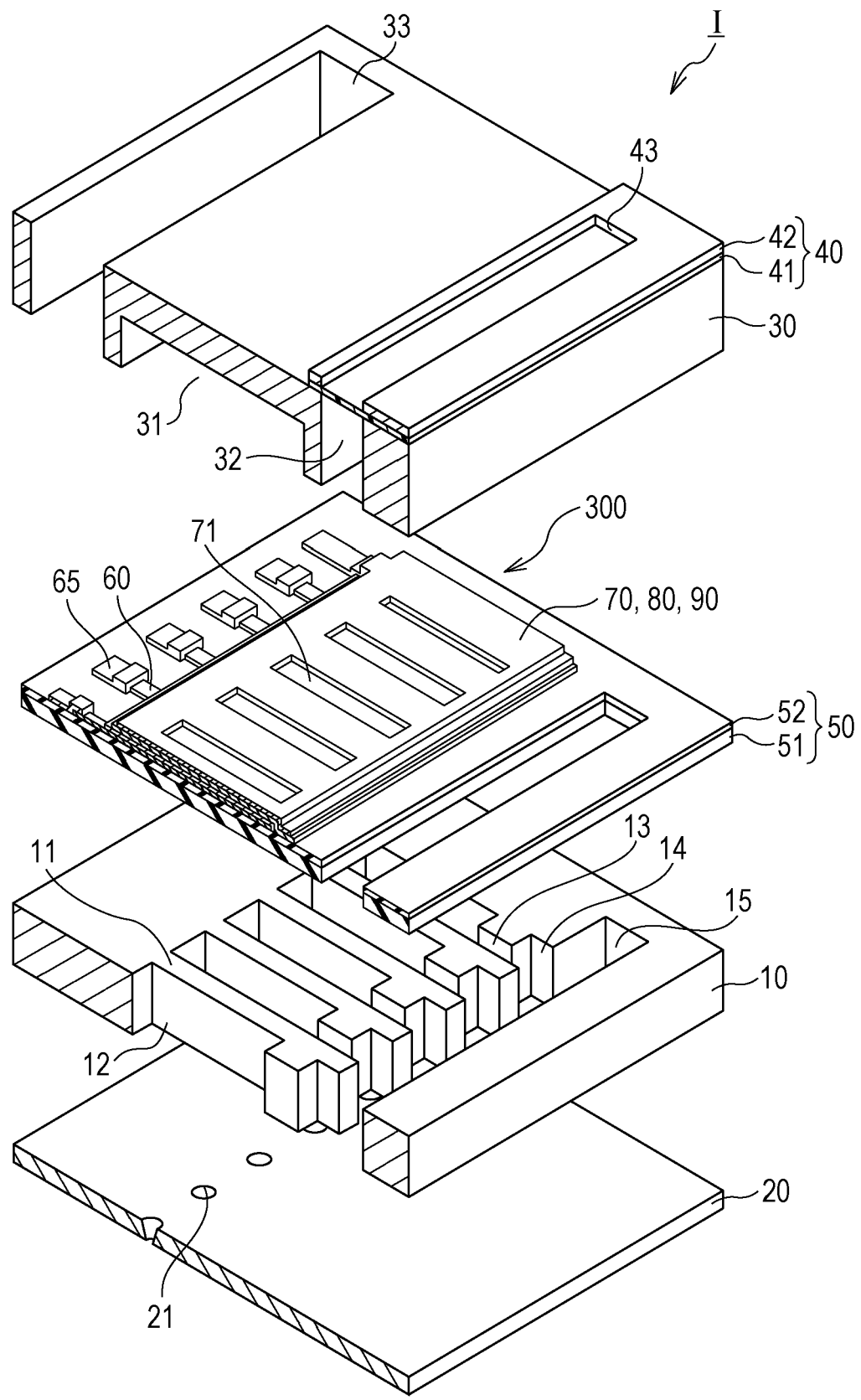
FIG. 1 is an exploded perspective view illustrating a liquid ejecting head according to an embodiment of the invention.
Figure 2A:
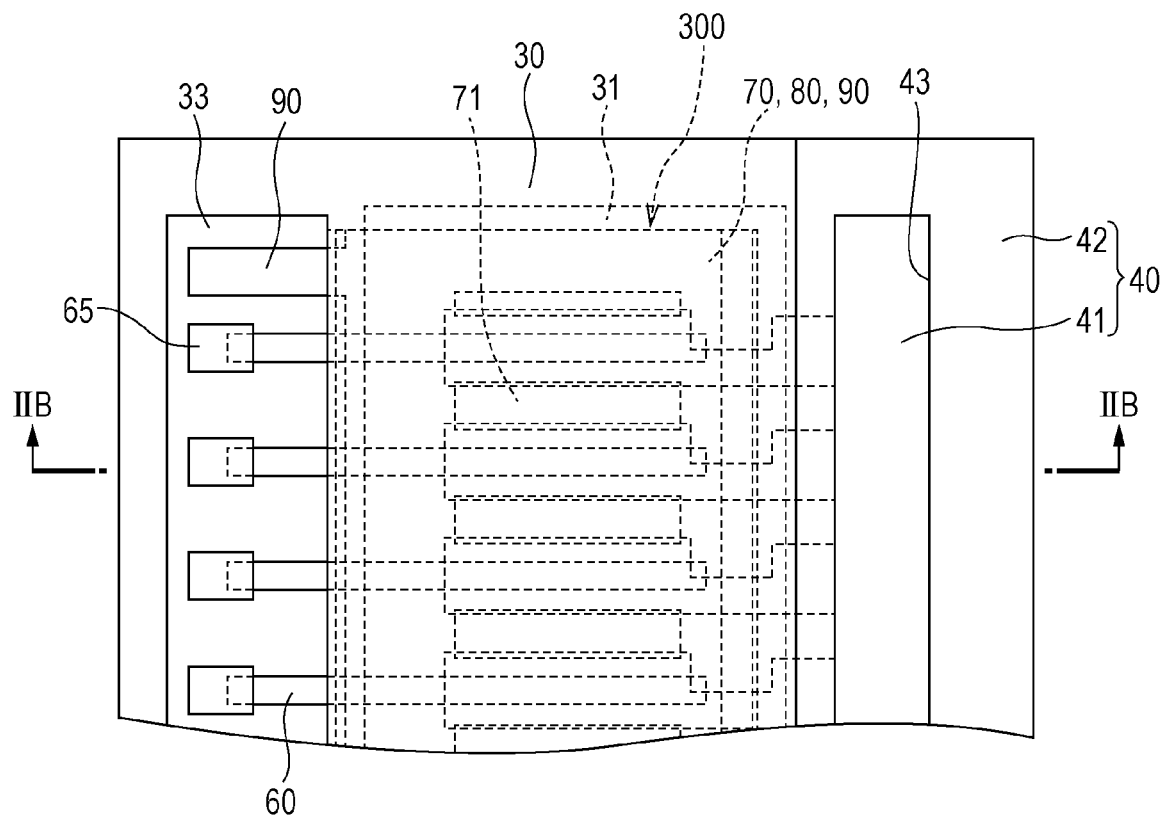
FIGS. 2A and 2B are a plan view and a cross-sectional view illustrating the liquid ejecting head according to the embodiment of the invention, respectively.
Figure 2B:
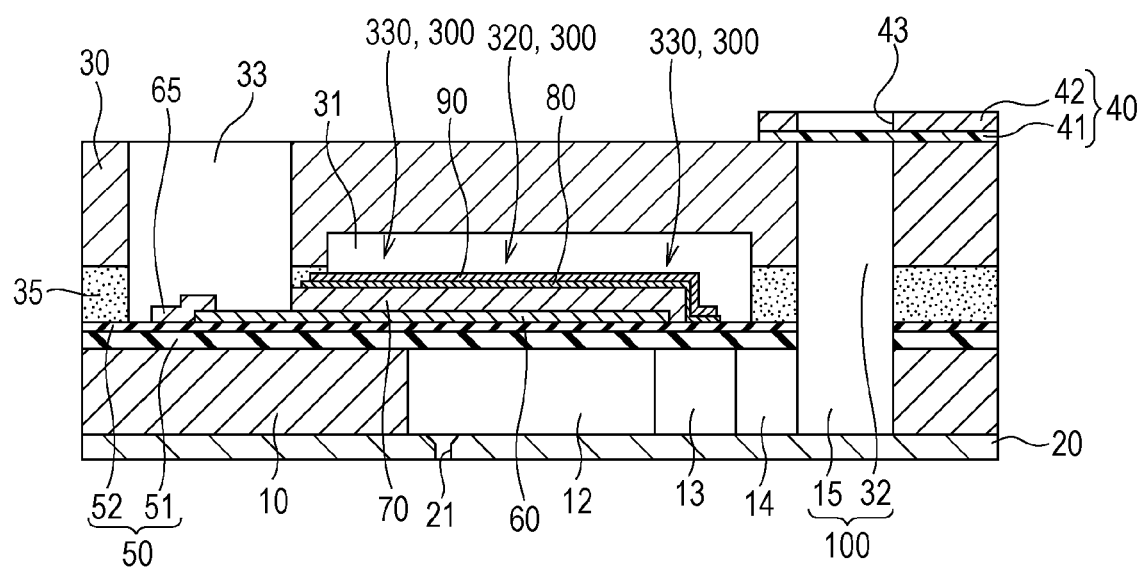

Hereinafter, an embodiment of the invention will be described with reference to the drawings.
First Embodiment As illustrated in FIGS. 1, 2A and 2B, in a flow path formation substrate 10 included in an ink jet type recording head I that is an example of the liquid ejecting head, a pressure generation chambers 12 defined by a plurality of partition walls 11 are arranged parallel with each other in a width direction (a lateral direction) thereof. In addition, an ink supply path 13 and a communication path 14 are defined by the partition walls 11 on one end side of the pressure generation chamber 12 of the flow path formation substrate 10 in the longitudinal direction thereof. A communication section 15, configuring a portion of a manifold 100 forming a common ink chamber (a liquid chamber) of each pressure generation chamber 12, is formed on the outside of the communication path 14. In addition, the flow path formation substrate 10 has a liquid flow path configured of the pressure generation chamber 12, the ink supply path 13, the communication path 14 and the communication section 15.

A nozzle plate 20, on which a nozzle 21 communicating with each pressure generation chamber 12 is pierced, is bonded to one side of the flow path formation substrate 10, that is, to a surface to which the liquid flow path of the pressure generation chamber 12 or the like is open by adhesive or heat welding.

A vibration plate 50 is formed on the other side of the flow path formation substrate 10. The vibration plate 50 according to the embodiment is configured of an elastic film 51 formed on the flow path formation substrate 10 and an insulating film 52 formed on the elastic film 51. In addition, the liquid flow path such as the pressure generation chamber 12 is formed by anisotropic etching the flow path formation substrate 10 from the other side surface thereof. One side surface of the liquid flow path such as the pressure generation chamber 12 is configured of the vibration plate 50 (the elastic film 51).

A piezoelectric element 300, configured of a first electrode 60 having, for example, a thickness of about 0.2 μm, a piezoelectric layer 70 having, for example, a thickness of about 1.0 μm and a second electrode 80 having, for example, a thickness of about 0.05 μm, is formed on an insulating film 52. The vibration plate 50 and the piezoelectric element 300 constitute an actuator.

Figure 3:
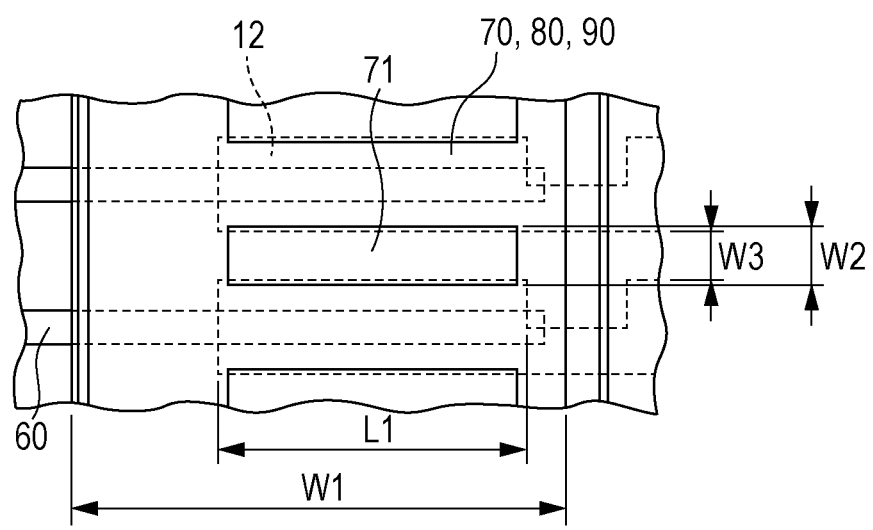
FIG. 3 is a plan view illustrating a configuration of a piezoelectric element according to the embodiment of the invention.
Figure 4A:
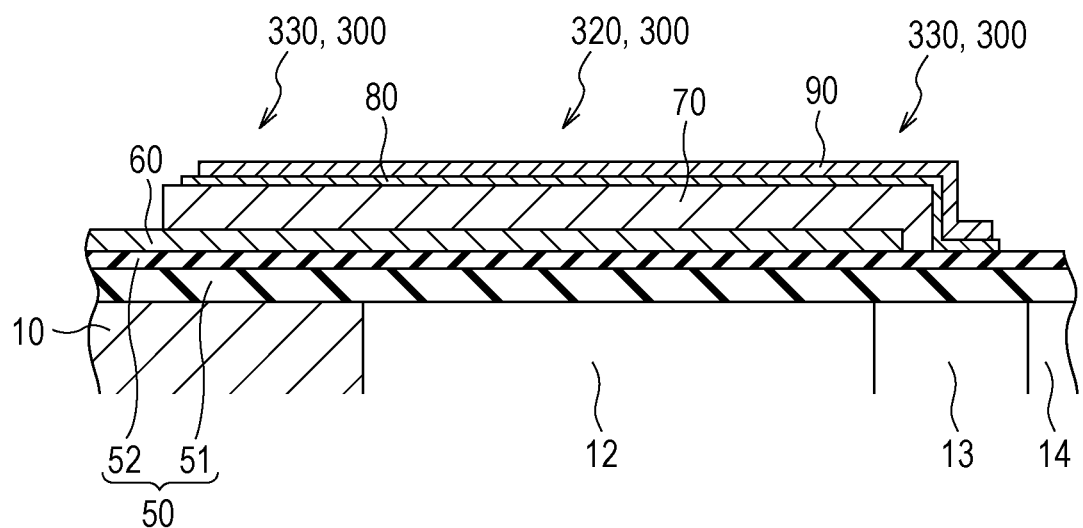
FIGS. 4A and 4B are cross-sectional views illustrating the configuration of the piezoelectric element according to the embodiment of the invention.
Figure 4B:
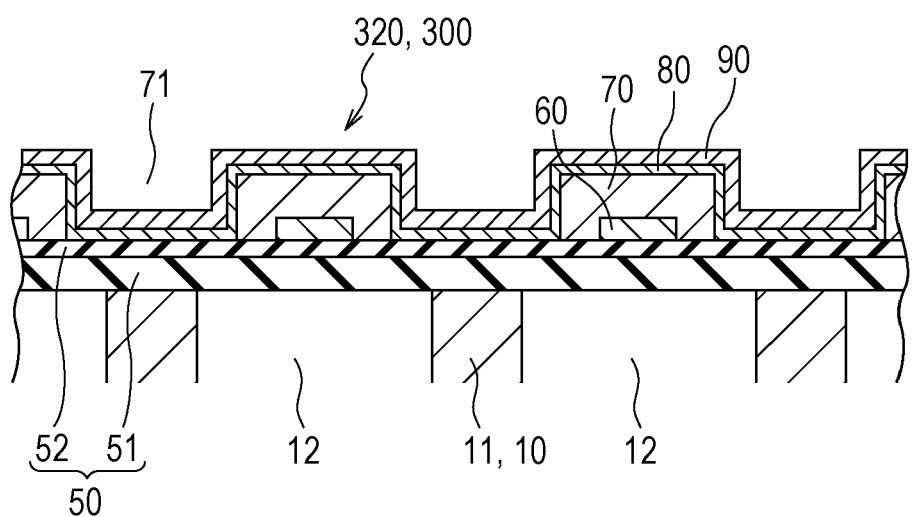

Hereinafter, the piezoelectric element 300 configuring the actuator will be described in detail. As illustrated in FIGS. 3, 4A and 4B, the first electrode 60 configuring the piezoelectric element 300 is cut and divided for each pressure generation chamber 12 and configures an individual electrode independently for each piezoelectric element 300. Then, the width of the first electrode 60 is narrower than the width of the pressure generation chamber 12 in the width direction (a lateral direction) of the pressure generation chamber 12. In other words, the end portion of the first electrode 60 is positioned inside a region facing the pressure generation chamber 12 in the width direction of the pressure generation chamber 12. Both end portions of the first electrode 60 extend to the outside of the pressure generation chamber 12, respectively in the longitudinal direction of the pressure generation chamber 12. In addition, a material of the first electrode 60 is not particularly limited as long as it is a metal material and, for example, platinum (Pt), iridium (Ir) or the like is preferably used.

The piezoelectric layer 70 is continuously provided throughout a region facing a plurality of pressure generation chambers 12 which are arranged in parallel with each other with a predetermined width W1. The predetermined width W1 is wider than a length L1 of the pressure generation chamber 12 in the longitudinal direction thereof. As a result, the piezoelectric layer 70 is provided to the outside of pressure generation chamber 12 in the longitudinal direction of the pressure generation chamber 12. The end portion of the piezoelectric layer 70 is positioned outside more than the end portion of the first electrode 60 in the one end side (the ink supply path side in the embodiment) of the pressure generation chamber 12 in the longitudinal direction. In other words, the end portion of the first electrode 60 is covered by the piezoelectric layer 70. The end portion of the piezoelectric layer 70 is positioned inside (pressure generation chamber 12 side) more than the end portion of the first electrode 60 in the other end side of the pressure generation chamber 12 in the longitudinal direction.

In addition, a lead electrode 65 formed of, for example, gold (Au) is connected to the first electrode 60 extending to the outside of the piezoelectric layer 70. The lead electrode 65 configures a terminal section (not illustrated) connected to a connection wiring which leads to a driving circuit.

In addition, the piezoelectric layer 70 has a concave section 71 facing each of the partition walls 11. A width W2 of the concave section 71 is substantially the same as a width W3 of each of partition walls 11 or wider than that. Accordingly, since stiffness of a portion (a so-called an arm portion of the vibration plate 50) of the vibration plate 50 facing the end portion of the pressure generation chamber 12 is suppressed in the width direction, the piezoelectric element 300 can be preferably displaced.

As a material of the piezoelectric layer 70, for example, ferroelectric piezoelectric material such as lead zirconate titanate (PZT), relaxor ferroelectric in which metal such as niobium, nickel, magnesium, bismuth or yttrium is added to the ferroelectric piezoelectric material may be used.

The second electrode 80 is continuously provided on the piezoelectric layer 70 including the concave section 71 in the arrangement direction of the pressure generation chamber 12 and configures a common electrode that is common to a plurality of the piezoelectric elements 300. The end portion of the second electrode 80 in the one end side of the pressure generation chamber 12 in the longitudinal direction is positioned outside more than the end portion of the piezoelectric layer 70 in one end side of the pressure generation chamber 12 in the longitudinal direction. In other words, the end portion of the piezoelectric layer 70 is covered by the second electrode 80. The end portion of the second electrode 80 is positioned inside (the pressure generation chamber 12 side) more than the end portion of the piezoelectric layer 70 in the other end side of the pressure generation chamber 12 in the longitudinal direction. The material of the second electrode 80 is not particularly limited as long as it is a metal material and, for example iridium (Ir) or the like is preferably used.

The piezoelectric element 300 having such a configuration is displaced by applying the voltage between the first electrode 60 and the second electrode 80. In other words, the piezoelectric strain occurs on the piezoelectric layer 70 interposed between the first electrode 60 and the second electrode 80 by applying the voltage between both electrodes. Then, when the voltage is applied to the both electrodes, the portion in which the piezoelectric strain occurs on the piezoelectric layer 70 is referred to as an active portion. In addition, the portion in which the piezoelectric strain does not occur on the piezoelectric layer 70 is referred to as a non-active portion. Then, the portion facing the pressure generation chamber in the active portion in which the piezoelectric strain occurs on the piezoelectric layer is referred to as a flexible section 320.

In addition, the portion outside the pressure generation chamber is referred to as a non-flexible section 330.

In the embodiment, all of the first electrode 60, the piezoelectric layer 70 and the second electrode 80 are continuously provided to the outside of the pressure generation chamber 12 in the longitudinal direction of the pressure generation chamber 12, thereby serving as the active section. Thus, the portion facing the pressure generation chamber 12 of the piezoelectric element 300 is the flexible section 320 and the portion outside the pressure generation chamber 12 is the non-flexible section 330.

A third electrode 90 is further provided on the second electrode 80 configuring the piezoelectric element 300. The third electrode 90 is continuously provided by covering the region facing each pressure generation chamber 12. In the embodiment, the third electrode 90 is provided by covering substantially entire surface of the second electrode 80. In addition, the third electrode 90 is formed thicker than the film thickness of the second electrode 80.

Since the third electrode 90 is provided, it is possible to suppress destruction of the piezoelectric layer 70 at the boundary between the flexible section 320 and the non-flexible section 330 of the piezoelectric element 300 due to the stress concentration or the like. In the embodiment, the boundary between the flexible section 320 and the non-flexible section 330 corresponds to the end portion of the pressure generation chamber 12 and the third electrode 90 is provided by covering the region facing the pressure generation chamber 12 so that the stress concentration is suppressed at the boundary portion between the flexible section 320 and the non-flexible section 330. Accordingly, the destruction of the piezoelectric layer 70 due to the stress concentration can be effectively suppressed.

In addition, since the third electrode 90 is provided, a resistance value of the second electrode 80 is substantially decreased. Thus, when the voltage is applied to the plurality of the piezoelectric elements 300, it is possible to suppress an occurrence of voltage drop due to the resistance of the second electrode 80. Accordingly, the ink droplets can be favorably ejected from each nozzle 21 and uniformity of the ejection characteristics can be achieved.

However, since the destruction of the piezoelectric layer 70 is suppressed at the boundary portion between the flexible section 320 and the non-flexible section 330 of the piezoelectric element 300, for example, as illustrated in FIG. 5, the third electrode 900 may be provided only on the boundary portion thereof. According to the configuration, the destruction of the piezoelectric layer 70 can be suppressed at the boundary between the flexible section 320 and the non-flexible section. Furthermore, since the third electrode 900 is not substantially formed on the flexible section 320, decrease in the displacement of the piezoelectric element 300 is also suppressed. In addition, the area of the third electrode 900 becomes narrow and it is possible to reduce the resistance of the second electrode 80 by thickly forming the third electrode 900 correspondingly.

However, in such a configuration, the end portion of the third electrode 900 is positioned on the pressure generation chamber 12. Thus, when the piezoelectric element 300 is driven, the stress concentration occurs in the vicinity of the third electrode 900 and a new problem may be caused in which burning, cracks or the like of the piezoelectric layer 70 occurs.

On the other hand, in the invention, the third electrode 90 is provided by covering the region facing the pressure generation chamber 12. Especially, in the embodiment, the third electrode 90 is provided throughout the entire surface of the second electrode 80. Thus, when the piezoelectric element 300 is driven, the stress concentration does not occur due to the third electrode 90. Accordingly, it is possible to effectively suppress the destruction of the piezoelectric layer 70 due to the stress concentration.

In addition, the resistance value of the second electrode 80 can be sufficiently decreased by forming the third electrode 90 in a wide range even though the film thickness is relatively thin. Accordingly, the displacement of the piezoelectric element 300 is not significantly inhibited by the third electrode 90 by thinning the thickness of the film of the third electrode 90. Thus, also it is possible to suppress, for example, degradation of the ejection characteristics such as an ejection speed and an ejection amount of the ink droplets.

For example, in the configuration of the piezoelectric element illustrated in FIG. 5, in order to sufficiently reduce the resistance value of the second electrode 80, the film thickness of the third electrode 900 must be substantially 1100 nm. On the other hand, for example, in the configuration of the embodiment illustrated in FIGS. 4A and 4B, the resistance of the second electrode 80 can be sufficiently decreased even though the film thickness of the third electrode 90 is significantly thin as substantially 250 to 400 nm depending on the material thereof. Accordingly, the destruction of the piezoelectric layer 70 due to the stress concentration can be suppressed without significantly reducing the displacement of the piezoelectric element 300 by the third electrode 90.

In addition, the third electrode 90 may be a configuration having one layer and be a configuration having plurality of layers. In any case, it is preferable that the third electrode 90 be formed from a material having a relatively low resistivity (specific resistance). Furthermore, it is preferable that the third electrode 90 be formed from a material having Young's modulus lower than the second electrode 80. Particularly, it is preferable that the third electrode 90 be formed from at least a material selected from, for example, a group consisting of Au, Ag, Cu and Al. Incidentally, although not illustrated in the drawings, the third electrode 90 is formed on the second electrode 80 via a contact layer formed from, for example, nickel chromium (NiCr) or the like.

Since the third electrode 90 described above is provided on the second electrode 80, the resistance value of the second electrode 80 is further reliably decreased and occurrence of degradation of the ejection characteristics due to the voltage drop can be effectively suppressed. In addition, the decrease in the displacement of the piezoelectric element 300 is also reliably suppressed.

In addition, in the embodiment, for example, the third electrode 90 has a tensile stress of gold (Au). Meanwhile, the second electrode 80 has, for example, a compressive stress of iridium (Ir). In this case, it is preferable that the tensile stress of the third electrode 90 is lower than the compressive stress of the second electrode 80. In other words, the stress (absolute value) of the third electrode 90 is lower than the stress (absolute value) of the second electrode 80. Accordingly, initial deformation of the vibration plate 50 can be suppressed in a portion (a so-called arm portion of the vibration plate 50) of the vibration plate 50 corresponding to the end portion of the of the pressure generation chamber 12 in the width direction. Accordingly, the displacement amount of the vibration plate 50 can be substantially improved by driving the piezoelectric element 300.

In addition, in the embodiment, the third electrode 90 is formed on substantially the entire surface of the second electrode 80 with a substantially uniform thickness and as illustrated in FIG. 6, for example, the film thickness of the portion facing the end portion of the pressure generation chamber 12 in the longitudinal direction may be thicker than the film thickness of a region (a center portion thereof) facing the pressure generation chamber 12. In other words, the portion of the third electrode 90 facing the end portion of the pressure generation chamber 12 in the longitudinal direction may have a thick section 91 of which the film thickness is thicker than the film thickness of the region facing the pressure generation chamber 12. The thick section 91 may be provided only on the portion facing the end portion of the pressure generation chamber 12 in the longitudinal direction; however, it may be provided on the entire region of the outside of the pressure generation chamber 12.

Since the third electrode 90 is configured as described above, the resistance value of the second electrode 80 can be reliably decreased. In addition, since the third electrode 90 is provided substantially on the entire surface of the second electrode 80, it is not necessary that the thickness of the thick section 91 is extremely thick compared to other portions even in a case where the thick section 91 is provided on a portion of the third electrode 90. Accordingly, the stress concentration is low in the portion corresponding to the end portion of the thick section 91 and the possibility of the destruction of the piezoelectric layer 70 due to the stress concentration is low.

A protection substrate 30 protecting the piezoelectric element 300 is bonded on the flow path formation substrate 10 on which the piezoelectric element 300 is formed by adhesive 35. The protection substrate 30 has a piezoelectric element holding section 31 that is a concave section defining a space which stores the piezoelectric element 300. In addition, the protection substrate 30 has a manifold section 32 configuring a portion of the manifold 100. The manifold section 32 is formed throughout the pressure generation chamber 12 in the width direction by passing throughout the protection substrate 30 in the thickness direction. In addition, the manifold section 32 communicates with the communication section 15 of the flow path formation substrate 10 as described above. In addition, the protection substrate 30 has a through hole 33 passing throughout the protection substrate 30 in the thickness direction. The lead electrode 65 connected to the first electrode 60 of each piezoelectric element 300 exposes inside the through hole 33. Furthermore, the third electrode 90 is also extended to inside the through hole 33. Although not illustrated in the drawings, one end of a connection wiring connected to a driving circuit is connected to the lead electrode 65 and the third electrode 90 inside the through hole 33.

A compliance substrate 40, configured of a sealing film 41 and a fixing plate 42, is bonded on the protection substrate 30. The sealing film 41 is formed from a material having low stiffness and flexibility, and one side surface of the manifold section 32 is sealed by the sealing film 41. In addition, the fixing plate 42 is formed from a solid material such as metal. Since a region of the fixing plate 42 facing the manifold 100 is an opening section 43 which is completely removed in the thickness direction, one side surface of the manifold 100 is sealed only by the sealing film 41 having the flexibility.

In the ink jet type recording head I of the embodiment as described above, the ink is taken in from an ink introduction port connected to an outside ink supply unit (not illustrated) and the ink is filled in the interior from the manifold 100 to the nozzle 21 and then the voltage is applied between the first electrode 60 and the second electrode 80 corresponding to the pressure generation chamber 12, respectively, according to the recording signal from the driving circuit. Accordingly, the vibration plate 50 is flexural deformed with the piezoelectric element 300. Thus, the pressure inside each pressure generation chamber 12 is increased and the ink droplets are ejected from each nozzle 21.

Figure 7:
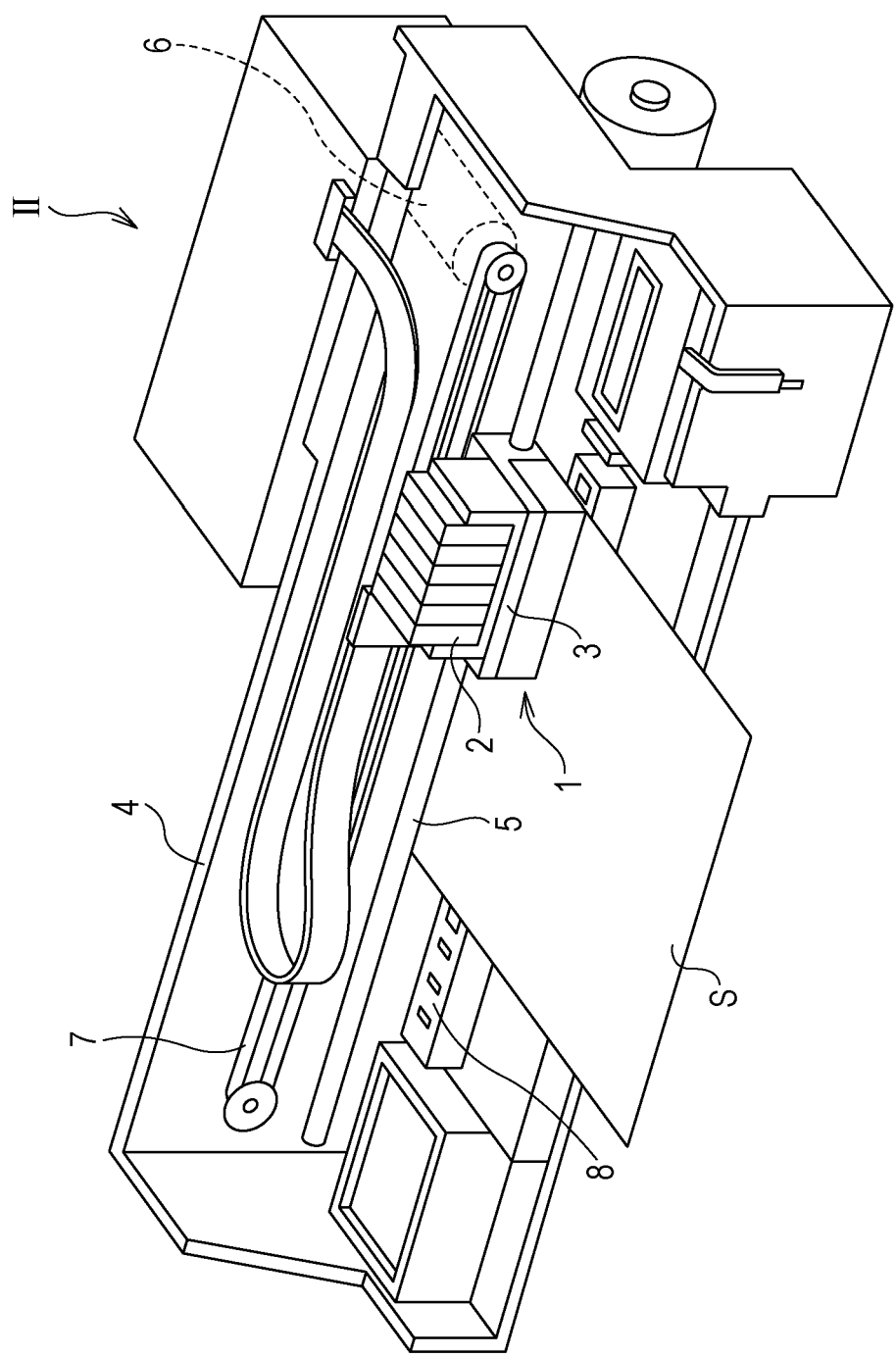
FIG. 7 is a schematic view illustrating a liquid ejecting apparatus according to an embodiment of the invention.

In addition, as illustrated in FIG. 7, for example, the ink jet type recording head I is mounted on an ink jet type recording apparatus II. In a recording head unit 1 having the ink jet type recording head I, a cartridge 2 configuring the ink supply unit is detachably provided and a carriage 3 having the recording head unit 1 is provided movable in the axial direction on a carriage shaft 5 which is installed on the apparatus body 4. The recording head unit 1 ejects, for example, black ink composition and color ink composition.

Then, since a driving force of a driving motor 6 is transmitted to the carriage 3 via a plurality of gears (not illustrated) and a timing belt 7, the carriage 3 mounted on the recording head unit 1 is moved along the carriage shaft 5. Meanwhile, a platen 8 is provided on the apparatus body 4 along the carriage shaft 5. A recording sheet S that is a recording medium such as a paper fed by a feeding roller (not illustrated) is wound on the platen 8 and transported.

Then, in the invention, uniformity of the ejection characteristics can be achieved while suppressing the destruction of the piezoelectric element 300 configuring the ink jet type recording head I as described above. As a result, the ink jet type recording apparatus II having improved print quality and high durability can be realized.

As described above, an embodiment of the invention is described; however, the invention is not limited to the above embodiment.

For example, in the embodiment described above, the configuration, in which the piezoelectric layer 70 of each piezoelectric element 300 is continuously provided, is exemplified; however, of course, the piezoelectric layer 70 may be provided for each piezoelectric element 300, independently. Furthermore, the configuration, in which a cross-sectional shape of the piezoelectric layer 70 is substantially rectangular shape; however, the cross-sectional shape of the piezoelectric layer 70 may be trapezoid.

In addition, the embodiment described above, the configuration, in which the opening shape of the pressure generation chamber 12 is substantially rectangular-shaped, is exemplified; however, the opening shape of the pressure generation chamber 12 is not specifically limited and, for example, may be a parallelogram.

In addition, for example, in the embodiment described above, as the ink jet type recording apparatus II, the apparatus, in which the ink jet type recording head I is mounted on the carriage 3 and moves in the main scanning direction; however, the configuration thereof is not specifically limited. The ink jet type recording apparatus II may be, for example, a so-called line type recording apparatus in which the ink jet type recording head I is fixed and the recording sheet S such as the paper is moved in a sub-scanning direction and then the printing is performed.

In addition, in the embodiment described above, the invention is described in which the ink jet type recording head as an example of the liquid ejecting head is exemplified; however, the invention is intended for general liquid ejecting heads widely. Besides various types of recording heads used in the image recording apparatus such as the printer, the liquid ejecting head, for example, may be a color material ejecting head used in manufacturing a color filter of a liquid crystal display or the like, an electrode material ejecting head used in electrode formation of organic EL display, field emission display (FED) or the like, a bioorganic matter ejecting head used in manufacturing a bio chip, or the like.

Furthermore, the invention can be applied to an actuator mounted on any apparatus as well as such a liquid ejecting head (ink jet type recording head). For example, the actuator of the invention can be also applied to various sensors or the like.

The entire disclosure of Japanese Patent Application No. 2012-086886, filed Apr. 5, 2012 is expressly incorporated by reference herein.

What is claimed is:

1. A liquid ejecting head comprising:
a flow path formation substrate including a pressure generation chamber communicating with a nozzle;
a vibration plate provided on the flow path formation substrate;
a piezoelectric element having a first electrode provided on the vibration plate, a piezoelectric layer provided on the first electrode and a second electrode provided on the piezoelectric layer; and
a third electrode provided on the second electrode,
wherein the first electrode configures an individual electrode that is independent for each piezoelectric element and the second electrode configures a common electrode which is common in a plurality of the piezoelectric elements continuously provided along an arrangement direction of the pressure generation chamber,
the first electrode, the piezoelectric layer and the second electrode are extended to the outside of the pressure generation chamber in a longitudinal direction of the pressure generation chamber,
the third electrode is provided by covering a region facing the generation chamber, and
the third electrode is configured such that a film thickness of a portion facing an end portion of the pressure generation chamber in the longitudinal direction is thicker than a film thickness of a region facing the pressure generation chamber.

2. The liquid ejecting head according to claim 1,
wherein a film thickness of the third electrode is thicker than a film thickness of the second electrode.

3. The liquid ejecting head according to claim 1,
wherein the third electrode is provided throughout the entire surface of the second electrode.

4. The liquid ejecting head according to claim 1,
wherein the third electrode has a tensile stress and the second electrode has a compressive stress, and
wherein the tensile stress of the third electrode is lower than the compressive stress of the second electrode.

5. The liquid ejecting head according to claim 1,
wherein the third electrode is formed of a material of which Young's modulus is smaller than that of the second electrode.

6. The liquid ejecting head according to claim 1,
wherein the third electrode is formed of at least one material selected from the group consisting of Au, Ag, Cu and Al.

7. A liquid ejecting apparatus including the liquid ejecting head according to claim 1.

8. A liquid ejecting apparatus including the liquid ejecting head according to claim 2.

9. A liquid ejecting apparatus including the liquid ejecting head according to claim 3.

10. A liquid ejecting apparatus including the liquid ejecting head according to claim 4.

11. A liquid ejecting apparatus including the liquid ejecting head according to claim 5.

12. A liquid ejecting apparatus including the liquid ejecting head according to claim 6.

13. An actuator comprising:
a vibration plate provided on a substrate, the substrate including a pressure generation chamber;
a piezoelectric element having a first electrode provided on the vibration plate, a piezoelectric layer provided on the first electrode and a second electrode provided on the piezoelectric layer; and
a third electrode provided on the second electrode,
wherein the first electrode configures an individual electrode that is independent for each piezoelectric element and the second electrode configures a common electrode which is common in a plurality of the piezoelectric elements continuously provided along an arrangement direction of the pressure generation chamber,
the first electrode, the piezoelectric layer and the second electrode are extended to the outside of the pressure generation chamber in a longitudinal direction of the pressure generation chamber,
the third electrode is provided by covering a region facing the generation chamber, and
the third electrode is configured such that a film thickness of a portion facing an end portion of the pressure generation chamber in the longitudinal direction is thicker than a film thickness of a region facing the pressure generation chamber.

* * * * *